United States Patent [19]

Bourbeau, Jr. et al.

[11] Patent Number: 4,571,072
[45] Date of Patent: Feb. 18, 1986

[54] SYSTEM AND METHOD FOR MAKING CHANGES TO PRINTED WIRING BOARDS

[75] Inventors: Arthur J. Bourbeau, Jr., Methuen; John P. Doherty, Haverhill, both of Mass.

[73] Assignee: Honeywell Information Systems Inc., Waltham, Mass.

[21] Appl. No.: 537,901

[22] Filed: Sep. 30, 1983

[51] Int. Cl.⁴ ............................................. G03B 27/02
[52] U.S. Cl. ..................................... 355/79; 355/132
[58] Field of Search ............................. 355/40, 77–79, 355/132, 133, 125, 126; 364/489, 519, 520; 174/68.5

[56] References Cited

PUBLICATIONS

IBM Tech. Disclosure Bulletin, "Photographic Composite Generation", vol. 7, No. 7, Dec. 1964, pp. 628–629.

*Primary Examiner*—Richard A. Wintercorn
*Attorney, Agent, or Firm*—Faith F. Driscoll; John S. Solakian

[57] ABSTRACT

A computer aided design (CAD) system is operative to generate an output containing only the additions and deletions to an existing master artwork. The CAD output is in turn applied to photoplotter equipment which produces a "delete" artwork containing line representations of only the etch/wires to be deleted from the original master artwork and an "add" artwork containing line representations of ony the etch/wires to be added to the same original master artwork. These two artworks are photographically combined with the original master artwork in a predetermined manner to produce a new PWB artwork which incorporates the added and deleted wire changes.

30 Claims, 7 Drawing Figures

SYSTEM AND METHOD FOR MAKING CHANGES TO PRINTED WIRING BOARDS

BACKGROUND OF THE INVENTION

1. Field of Use

This invention relates to printed wiring boards and more particularly to systems and methods for making changes in printed wiring boards for correcting design errors or adding functional enhancements.

2. Prior Art

As is well known, printed wiring board designs are developed through the utilization of computer aided design (CAD) systems. These systems have interactive graphic and digitizing equipment used by a designer during the physical design and layout phases of a multilayer printer circuit board development.

Such CAD systems are used to provide a digitized output on a magnetic media. The output is in turn applied as an input to photoplotting equipment which generates the PWB artwork. The artwork is then used to fabricate the prototype or production version of the printed wiring board.

Following fabrication, the new printed wiring board is tested to validate or verify that the functional and productibility design requirements have been met. During the design verification cycle, any design errors are identified. The resolution of these errors is made by modifying the physical printed wiring boards by the addition of wires, the cutting of etches and the changing, addition or removal of components.

The elimination of the requirements to add wires and cut etches to the printed wiring boards necessitates the release of a new printed wiring board and associated artwork design. This release process is both lengthy and costly. It normally requires the generation of a new artwork by the CAD system (i.e., all of layers of a multilayer board) and the generation of all new manufacturing/fabrication tools including the recreation of new drill files, router tapes, insertion files, ring out files, etc.

The generation of the new PWB "artwork" involves replotting the locations of all circuit components or modules to be mounted on the board and the wire patterns for interconnecting all of the board components on all of the layers (i.e., plated through holes are used for interconnections between layers).

In general, the replotting function is carried out by the CAD system and necessitates the changing of the entire digital data base which, in turn, requires repetition of the different automated steps required for generation of the new digital data base (e.g. routing programs which route the wires and perform design rule checks for verifying the layout meets established reliability requirements).

The above procedure has been found quite time consuming and costly. To save time, one system employs a method in which the changes are only handled with respect to their effects on the circuitry. This method requires more complicated programming and data management. Also, it results in the documentation of the changes which are implemented by the addition of wires, etch cuts and component replacements. This system is described in the article "The Management of Engineering Changes Using the PRIMUS SYSTEM", by F. P. Mallmann, Proceedings of the 17th Design Automation Conference, Copyright 1980 by the Association for Computing Machinery.

Thus, in this system as in the above systems, until the new PCB design is made available, the process of adding wires and cutting etches to the PWBs being manufactured is required to continue. In this regard, it has been found that PWBs when so modified have been the source of equipment failures. To overcome this problem, some manufacturers have employed other types of processes for modifying each PWB separately. These processes involve spraying or screening metal based substances onto the PWB board. It has been found that the when PWBs modified in this manner have poor reliability either because of break down of the metal based substances or because the metal based substance did not provide the level of conductivity required for high density board construction.

Accordingly, it is a primary object of the present invention to provide a system and method of modifying printed wiring boards which reduces both design cycle time and cost of board construction.

It is a further object of the present invention to provide a system and method for modifying PWBs so as to maintain the same high reliability as the original unmodified PWB.

SUMMARY OF THE INVENTION

The above and other objects of the present invention are achieved in a preferred embodiment which includes a computer aided design system operative to generate an output containing only the additions and deletions to an existing master artwork. The CAD output is in turn applied to photoplotter equipment which produces a "delete" artwork containing line representations of only the etch/wires to be deleted from the original master artwork and an "add" artwork containing line representations of only the etch/wires to be added to the same original master artwork.

These two artworks are photographically combined with the original master artwork in a predetermined manner to produce a new PWB artwork which incorporates the added and deleted etch/wire changes. Because the process of the present invention only requires the generation of the additions and deletions to be made to the master artwork, computer time, photoplotter and inspection time is significantly reduced. Moreover, the new master artwork eliminates the need to add wires and make etch cuts in existing printed wiring boards. That is, it can be used to fabricate PWBs having the same reliability as the original PWB.

The novel features which are believed to be characteristic of the invention both as to its organization and method operation, together with further objects and advantages will be better understood from the following description when considered in connection with the accompanying drawings. It is to be expressly understood, however, that each of the drawings are given for the purpose of illustration and description only and are not intended as a definition of the limits of the present invention.

DESCRIPTION OF THE PREFERRED EMBODIMENT

Figure 1:
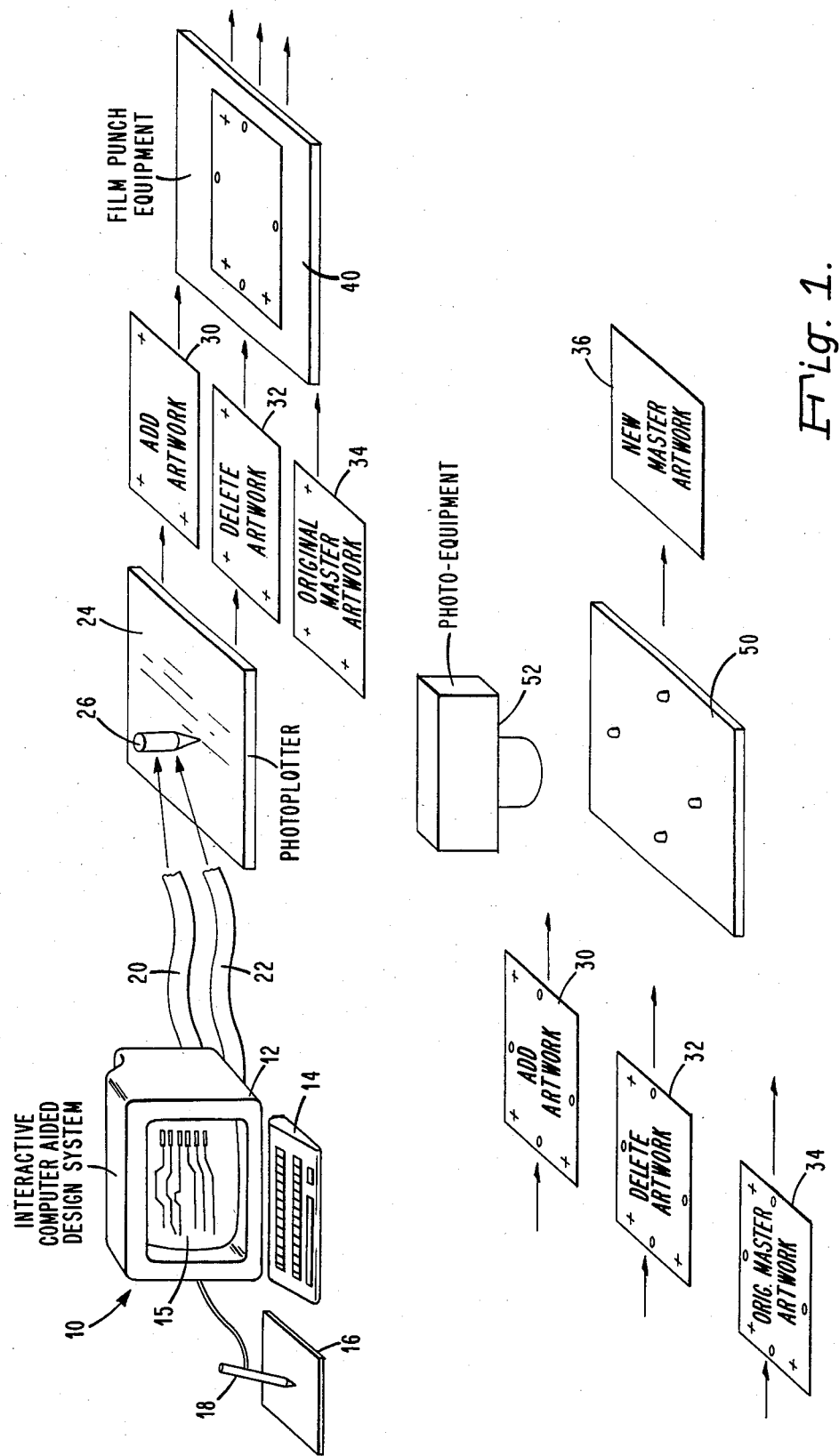
FIG. 1 is a block diagram of a preferred embodiment of the system of the present invention.

FIG. 1 is a block diagram of the preferred embodiment of the system of the present invention which utilizes the graphics adds and deletes (GAD) process of the present invention.

Referring to the Figure, it is seen that the system includes an interactive computer aided design (CAD) system 10. The system 10 is conventional in design and may, for example, take the form of the interactive graphics systems manufactured by Applicon Incorporated.

As shown, the system 10 includes a graphics display terminal unit 12 which includes a keyboard 14 and a tablet 16 with associated electric pen 18. A designer can call up an existing source document such as an original master artwork. By pointing to desired locations on the artwork displayed on the screen 15 with electronic pen 18 and using the function keys, the designer can generate the lines to be added to the artwork and lines to be deleted from the artwork.

Through the use of function keys, the designer is able to specify parameters such as sizes (width and length) of the added and deleted lines. The system 10 operates to digitize all of this new information and outputs, the results separately on magnetic tape. In FIG. 1, the separation is illustrated by two magnetic tapes 20 and 22.

As seen from FIG. 1, the digitized adds and deletes information, produced on tapes 20 and 22, are applied as an input to a photoplotter 24. The photoplotter 24 by activiting a photohead element 26 operates to plot the added lines and the deleted lines on sheets of an appropriate photographic plastic media (e.g. mylar film). The photoplotter 24 is conventional in design and may, for example, take the form of the Model 32B photoplotter manufactured by The Gerber Scientific Instrument Company.

The resulting two artworks 30 and 32 are applied o film punch equipment 40 along with the original master artwork 34. The equipment 40 operates to accurately pierce four registration slots in each artwork film in relation to three crosshairs photoplotted on the artworks.

The equipment 40 includes a surface plate or table onto which a work plate, its pneumatic and electrical components and a manually operated precision X-Y motion system (not shown), are mounted. A microscope and camera system (not shown) is mounted on linear bearings above the surface plate on a support. The system microscopes are used to view two orthogonal (alignment) lines on glass plates which are ridigly fixed to the work plate.

The alignment of artwork on the work plate is accomplished by matching a crosshair plotted on the PWB artwork with a crosshair in a spindle or rotary chuck on the work plate. The chuck or spindle is then rotated until the two alignment crosshairs plotted on the PWB artwork coincide with the alignment lines. Vacuum/pneumatic components are used to hold the artwork flat and ridigly in place.

When alignment is completed, four dies positioned perpendicular to each other are actuated which operate to punch four slots having 0.1875 dimensions of ±0.0002 inches at predetermined locations on the artwork as graphically illustrated in FIG. 1. For the purpose of the present invention, this equipment is conventional in design and, for example, takes the form of equipment manufactured by Northeastern Tool Company, Inc.

The punched artworks 30, 32 and 34 are combined photographically on a pinned contact frame table 50. The contact frame table 50 is conventional in design and may, for example, take the form of the Model 64A contact printer manufactured by R. W. Borrowdale Company. Photoequipment 52 in the form of a light source provides the desired film exposures required to produce the composite artworks required for the generation of a new master artwork 36 containing the added and deleted lines, as explained herein. Also, the photoequipment 52 includes film developing apparatus conventional in design which is used to process the exposed films.

DESCRIPTION OF OPERATION

Now that the system of FIG. 1 has been generally described, the operation of this system in carrying out the process of the present invention will now be described with reference to FIGS. 2 through 3b.

It is assumed that the original master artwork must be modified to reflect a number of engineering changes. As used herein, the term "artwork" refers to the image or topological layout of the conductor circuit pattern or printed wiring pattern of a printed wiring board on sheet film or glass or other plastic material. In this example, it is assumed that the particular engineering changes to be made require adding wires to the PWB and cutting etches in the PWB.

In a conventional manner, the designer using the CAD system 10 manually inputs the changes required to be made to the origina master artwork. That is, the designer introduces into the system, the X, Y coordinates of all of the lines to be added and all of the lines to be deleted. That is, the designer manually creates two separate files, one containing the etch/wire deletions and the other containing the etch/wire additions. At the same time, the designer visually verifies the correctness of the changes made to the artwork.

In addition to identifying the locations of the wire additions and deletions, the designer also designates the sizes of the etch/wire deletions and additions. In accordance with the teachings of the present invention, the sizes of the lines representative of etch/wire deletions are selected to be 0.002" greater in width than the lines on the original master artwork representative of the etches/wires to be removed. The overlap in width ensures that there is no residual left of the line being deleted as explained herein.

Also, the lines representative of the etch/wire additions are selected to be 0.001" greater in width than the standard etch widths used in the design. This is done to ensure that proper line width is maintained when contacting the emulsion to the base. Thus, the possibility of producing an unacceptable line width size on newly generated PWB master artwork is eliminated.

Also, according to the present invention, the length of the lines corresponding to the etch/wires to be removed is extended to the edges of their respective bonding pads. The lengths of the lines representative of the etch/wires to be added are extended approximately 25% beyond the centers of their respective bonding pads. This ensures that reliable interconnections are maintained.

Figure 2:
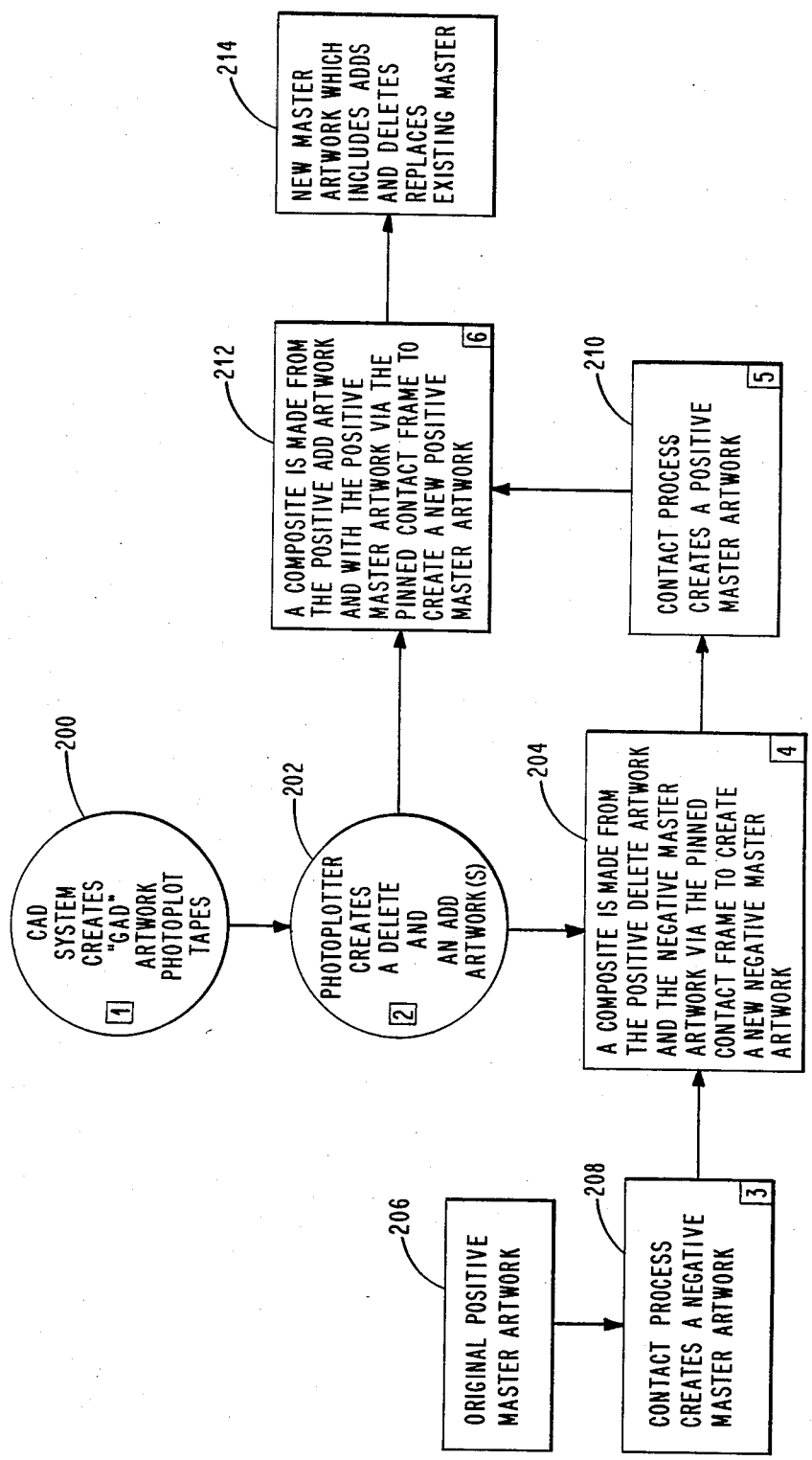
FIG. 2 is a flow diagram illustrating the operation of the system of FIG. 1.
Figure 3:
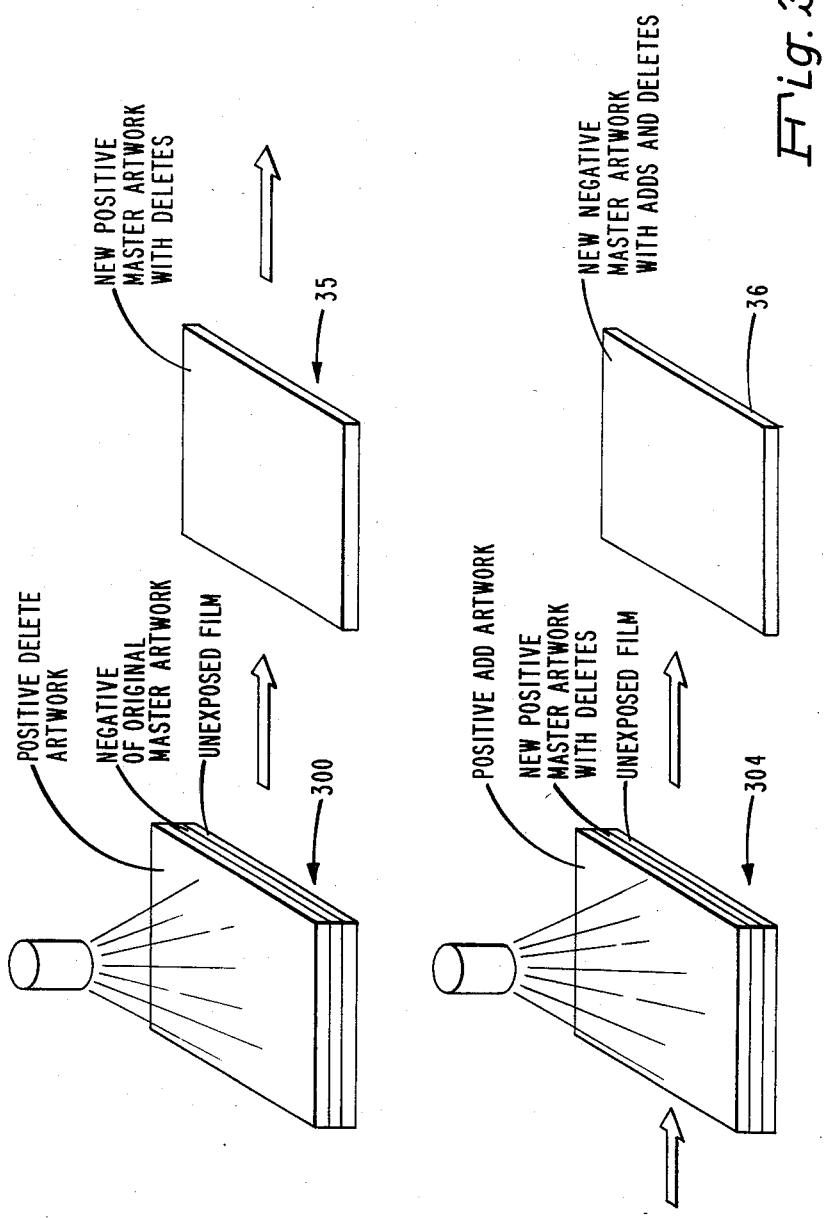
FIGS. 3a and 3b are diagrams used to illustrate in greater detail the photographic operations performed by the system of FIG. 1.
Figure 4A:
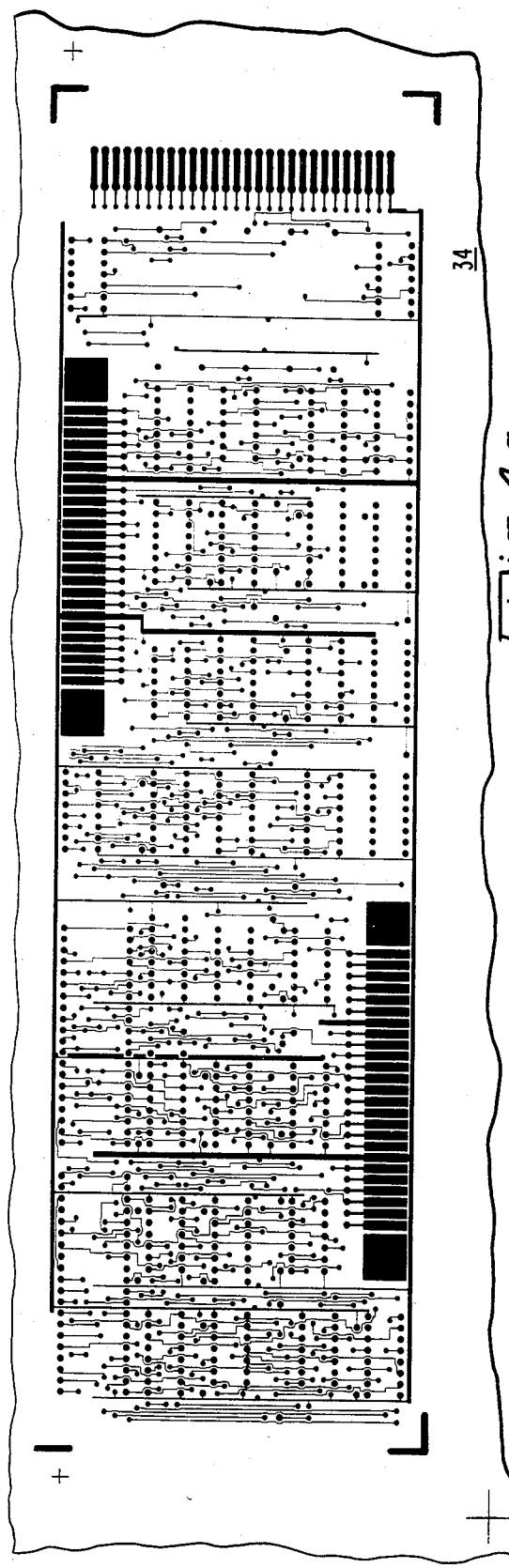
FIGS. 4a through 4d are examples of the types of artworks used and produced by the system of FIG. 1.
Figure 4B:
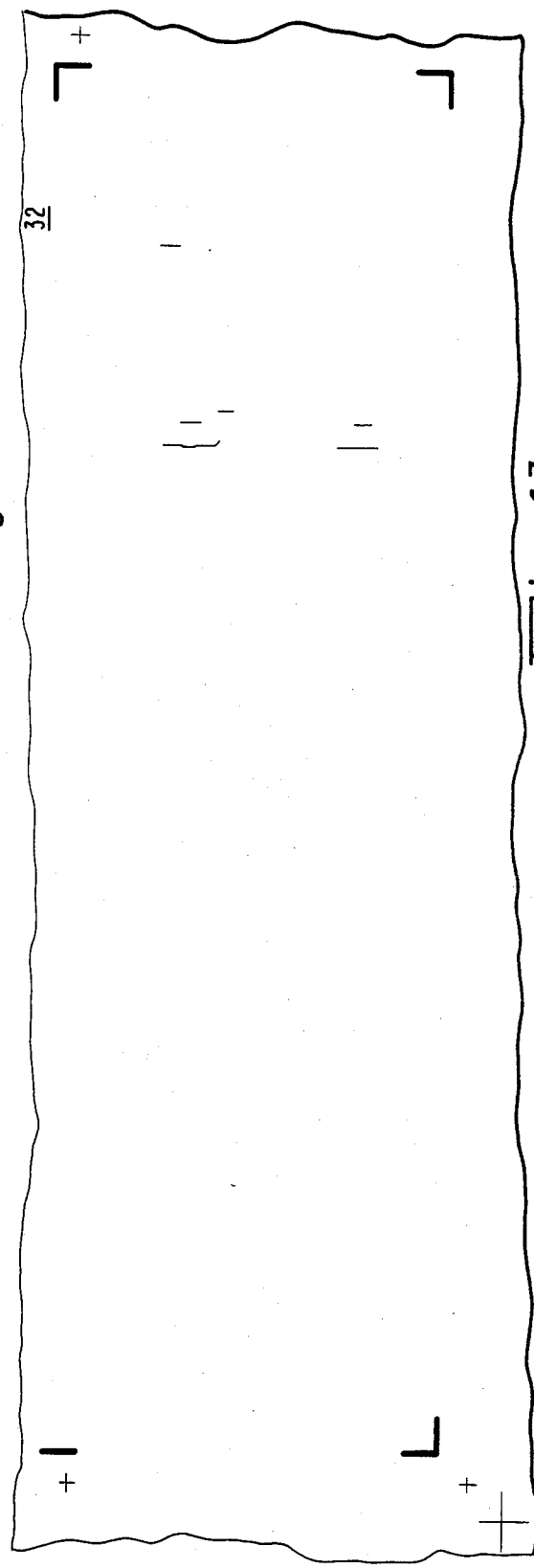

The CAD system 10 operates to output the manually generated digital information onto two magnetic tapes 20 and 22 of FIG. 1 as denoted by the step of block 200 of FIG. 2. These tapes are applied to the photoplotter 24 of FIG. 1 which performs the photographic process of plotting on a first sheet of unexposed photographic mylar film the lines representing the etch/wires to be deleted from the original master artwork 34. In this example, the "delete" artwork 32, shown in FIG. 4b, is produced.

Figures 4C, 4D:
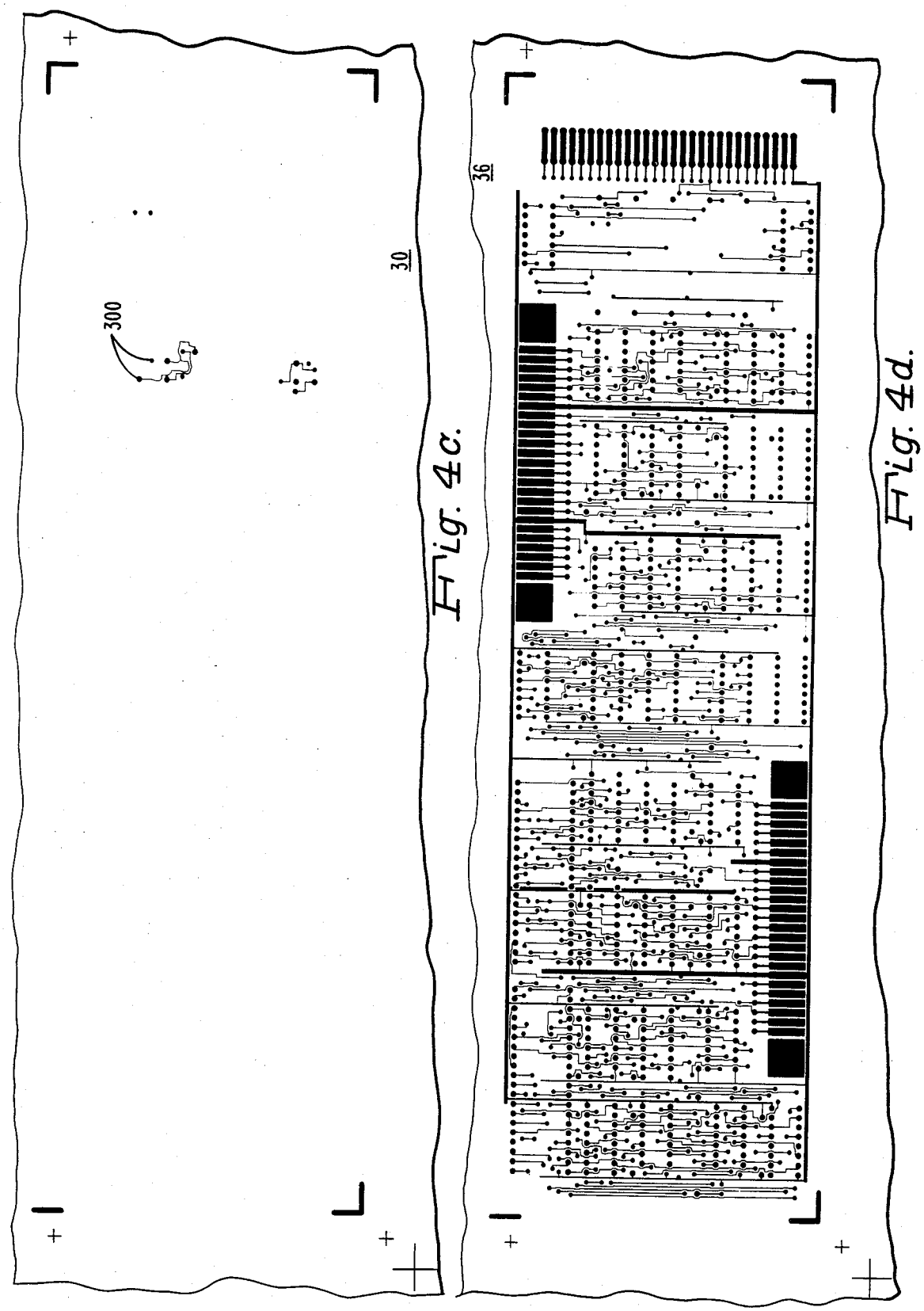

The photoplotter also plots on a second sheet of unexposed photographic mylar film the lines representing the etch/wires to be added to the original master artwork 34. In this example, the "add" artwork 30 of FIG. 4c is produced.

The "add" artwork 30 is distinguished by the fact that it contains both lines and associated bonding pads 300. The pads 300 are used only for identification purposes, since no changes are made to the artwork pads. That is, bonding pads are never added or deleted on the original master artwork. They are already preestablished and their locations are included on a numerically control generated drill tape which is used for drilling the required holes in the PWB. By eliminating the requirement of modifying or altering the bonding pads, this reduces the computer time which otherwise would have to be expended in generating new drill file information.

After peforming the operations of block 202, the "add" artwork 30, the "delete" artwork 32 and the original master artwork 34 are processed by the film punch equipment 40 as required.

As seen from FIG. 2, the negative of the master artwork 34 is generated in the manner indicated in blocks 206 and 208. More specifically, the originally master artwork 34 is placed on the pinned contact frame table 50 over a sheet of punched unexposed mylar film. The photoequipment 52 exposes the film and the master artwork image is developed on the mylar film by the photoequipment 52. The difference between the negative master artwork and the master artwork 34 of FIG. 4a is that the negative master artwork has an opaque background and the circuit pattern is transparent (clear).

In each instance, the sheets of unexposed mylar film and artworks are punched so as to include four registration slots. These slots enable the accurate alignment of the artworks and unexposed film during the generation of the required composites pursuant to blocks 204 and 212 of FIG. 2. In the case of the artworks, the registration slots are generated by the film punch equipment 40 using the crosshair points appearing on the artworks. The crosshair points are generated by photoplotter 24. Similar registration slots on the sheets of unexposed mylar film are generated by an equivalent fixed punch arrangement (no alignment required for unexposed imageless film).

As seen from FIG. 2, a first composite artwork is made by photographically combining the positive "delete" artwork 32 and the negative master artwork. This operation is illustrated diagrammatically by block 300 of FIG. 3. As shown, the positive "delete" artwork 34, the negative of the original master artwork 34 and a first punched unexposed sheet of mylar film are placed onto pinned contact table 50. The film is exposed and developed under the control of photoequipment 52. The result is a positive of a new master artwork in which the lines of FIG. 4b representative of etch/wires to be deleted from the PWB from the original master artwork have been removed. That is, the combination of a positive image and a negative film image eliminated the lines.

A further composite artwork is made by photographically combining the positive "add" artwork 30 and the positive new master artwork with deletes (i.e., first composite artwork) as indicated in block 212. That is, the positive "add" artwork 30, the positive new master artwork with deletes and a second unexposed punched sheet of mylar film are placed onto pinned contact frame table 50 as shown diagrammatically by block 304 of FIG. 3.

The film is exposed and developed under the control of photoequipment 52. The result is a negative of a new master artwork 36 which now also contains the lines of FIG. 4c representative of etch/wires to be added (first composite removed the lines of FIG. 4b representative of the etch/wires to be removed). That is, the combination of two positive film images added the required lines.

As seen from FIG. 2, the generation of the artwork of block 214 completes the process of the present invention. Thus, the master artwork 36 is generated by performing the sequence of operations labeled 1 through 6 in FIG. 2. It will be appreciated that the operation of block 210 (i.e., no. 5) results from carrying out the operation of block 204. The new negative master artwork 36 with adds and deletes can now be used to fabricate new printed wiring boards using standard techniques.

In the cases where there are no additions to be made to the original master artwork, the operations of block 212 are omitted. That is, the desired master artwork is produced by performing the sequence of operations labeled 1, 2, 3, 4 and 5 in FIG. 2. Thus, the new positive master artwork 35 of FIG. 3 replaces master artwork 36. Conversely, in cases where there are only additions to be made to the original master artwork, the positive of the original master artwork is used along with the positive of the "add" artwork as indicated by block 212 of FIG. 2. That is, the desired master artwork is generated by performing the sequence of operations labeled 1, 2 and 6 in FIG. 2. This produces a positive new master artwork which contains only lines representative of etch/wires to be added. It will be appreciated that this operation as well as the other operations which involve the processing of unexposed film are carried out under the appropriate lighting conditions (i.e., dark room environment).

While the above example only illustrated changes to a single layer of a PWB, changes to the remaining layers of a multilayer PWB are carried out in a similar fashion. It can be seen that as the number of board layers increase, a larger percentage of the engineering changes made to a PWB is likely to involve additions and/or deletions of etch/wires. Hence, the advantages of the system and process of the present invention become more valuable in saving computer time and in reducing the PWB release cycle.

The above has described a system and process which greatly reduces computer, photoplotting and inspection time normally required to incorporate engineering changes into a PWB design. Moreover, the process of the present invention results in a new master artwork which has the same degree of reliability as the original artwork automatically generated by a CAD system.

It will be obvious to those skilled in the art that many changes may be made to the preferred embodiment of the system and process of the present invention. For example, other types of equipment may be utilized and the size and length parameters of the etch lines altered as required. Also, instead of manually creating and verifying the "add" and "delete" artworks, these operations may be automated by including these operations as part of the artwork generation system. It will also be appreciated that the teachings of the present invention are directly applicable to making changes to artworks/masks used in manufacturing integrated circuit chips.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A method of making changes to an original master artwork containing an image of a printed wiring pattern of at least one layer of a multiwire printed circuit board, said method comprising the steps of:
   generating a first artwork containing a first image of only lines representative of wires/etches to be deleted from said original master artwork wiring pattern;
   generating a second artwork containing a second image of only lines representative of wires/etches to be added to said original master artwork wiring pattern; and,
   photographically combining said original master, said first and said second artworks for producing a new master artwork in which said lines of said first and second images have been removed and added respectively from said original wiring pattern.

2. The method of claim 1 wherein the step of photographically combining includes the steps of:
   photographically generating a first composite artwork by overlaying onto an unexposed sheet of film, said original master artwork and said first artwork, said first composite artwork containing said original wiring pattern in which said lines of said first image have been removed; and,
   photographically generating a second composite artwork by overlaying onto an unexposed sheet of film, said first composite artwork and said second artwork, said second composite artwork containing said original wiring pattern in which said lines of said first and second images have been removed and added respectively.

3. The method of claim 2 wherein each of said photographically generating steps includes the steps of:
   exposing said unexposed sheet of film so as to produce a composite artwork image; and,
   developing said unexposed sheet following exposure.

4. The method of claim 2 wherein said method further includes the step of:
   producing registration slots in said first, second and original master artworks and each of said sheets of unexposed film for enabling said artworks to be accurately aligned during each of said photographically generating steps.

5. The method of claim 4 wherein in each of said photographically generating steps, said artworks and unexposed sheet of film are overlayed on a pinned frame contact table and accurately aligned by said registration slots.

6. The method of claim 4 wherein each of said steps of generating said first and second artworks includes generating a number of reference marks at predetermined points on said artworks outside an area of said image and producing registration slots at locations defined by said reference marks.

7. The method of claim 1 wherein said steps of generating said first artwork and said second artwork respectively include the steps of:
   photoplotting on sheets of unexposed film only lines representative of said wires to be deleted from and added to said original master artwork wiring pattern thereby reducing substantially the amount of time required to generate a new master artwork.

8. The method of claim 7 wherein said step of generating said first artwork produces said lines to be greater in width than the lines on said original master artwork ensuring that no residuals of said lines being removed remain following said step of photographically combining.

9. The method of claim 8 wherein said step of generating said second artwork produces said lines to be greater in width than the lines on said original master artwork so as to ensure a predetermined line width size on said new master artwork.

10. The method of claim 9 wherein said step of generating said second artwork produces lines which are extended by the same predetermined amount so as to ensure that reliable interconnections are maintained within said wiring pattern of said new master.

11. The method of claim 1 wherein said printed circuit board has a plurality of layers, and each of the steps of said method are repeated for each of said plurality of layers.

12. A method of making changes to an original master artwork containing an image of a conductor design wiring pattern for fabricating an electronic device, said method comprising the steps of:
   generating at least a first positive artwork containing either a first image of only lines representative of conductor wires/etches to be deleted from or added to said image of said original master artwork conductor wiring pattern; and,
   photographically combining said original master and said first artwork for producing a new master artwork in which said lines of said first image having been either deleted from or added to said image of said original conductor design pattern.

13. The method of claim 12 wherein said changes require only the deletion of conductor wires/etches from said device, and said step of generating produces said first positive artwork containing a first image of only lines representative of conductor wires/etches to be deleted from said image of said original master artwork design wiring pattern, said step of photographically combining includes the step of:
   photographically generating a composite artwork by overlaying onto an unexposed sheet of film, a negative of said original master artwork and said first artwork, said composite artwork containing said original design wiring pattern in which said lines of said first image have been removed.

14. The method of claim 12 wherein said changes require only the addition of conductor wires/etches from said device and said step of generating produces said first artwork containing a first image of only lines representative of conductor wires/etches to be added to said image of said original master artwork design wiring pattern, said step of photographically combining includes the step of:

photographically generating a composite artwork by overlaying onto an unexposed sheet of film, said original master artwork and said first artwork, said composite artwork containing said original wiring pattern in which said lines of said first image have been added.

15. The method of claim 13 wherein said changes further require the addition of conductor wires/etches from said device and wherein said method further includes the step of:

generating a second positive artwork containing a second image of only lines representative of conductor wires/etches to be added to said device and said step of photographically combining further includes the step of:

photographically generating another composite artwork by overlaying onto an unexposed sheet of film, said composite artwork and said second positive artwork, said another composite artwork containing said original wiring pattern in which said lines of said first and second images have been removed and added respectively.

16. The method of claim 12 wherein said photographically generating step includes the steps of:

exposing said unexposed sheet of film so as to produce a composite artwork image; and,
  developing said unexposed sheet following exposure.

17. The method of claim 12 wherein said method further includes the step of:

producing registration slots in said first and original master artworks and each of said sheets of unexposed film for enabling said artworks to be accurately aligned during said photographically generating step.

18. The method of claim 17 wherein in said photographically generating step, said artworks and unexposed sheet of film are overlayed on a pinned frame contact table and accurately aligned by said registration slots.

19. The method of claim 17 wherein said step of generating said first artwork includes generating a number of reference marks at predetermined points on said artwork outside an area of said image and producing registration slots at locations defined by said reference marks.

20. The method of claim 12 wherein said step of generating said first artwork includes the step of:

photoplotting on a sheet of unexposed film either only lines representative of said wires to be deleted from or added to said image of said original master artwork wiring pattern thereby reducing substantially the amount of time required to generate a new master artwork.

21. The method of claim 20 wherein said step of generating said first artwork containing only lines representative of wires/etches to be deleted to said device produces said lines to be greater in width than the lines on said original master artwork ensuring that no residuals of said lines being removed remain following said photographically combining step.

22. The method of claim 21 wherein said step of generating said first artwork containing only lines representative of wires/etches to be added to said device produces said lines to be greater in width than the lines on said original master artwork so as to ensure a predetermined line width size on said new master artwork.

23. The method of claim 22 wherein said step of generating said first artwork produces lines which are extended by the same predetermined amount so as to ensure that reliable interconnections are maintained within said wiring pattern of said new master.

24. A method of making changes to any of the original master artworks containing images of printed wiring patterns corresponding to the different layers of a multi-wire printed circuit board, said method comprising the steps of:

(a) generating by a computer aided design system on a magnetic tape media, first and second sets of coded signals including signals representative of the wires/etches to be deleted from and added respectively to a first one of said original master artworks requiring correction;

(b) generating by photoplotting means in response to said first set of coded signals a first artwork containing a first image of only lines representative of wires/etches to be deleted from the wiring pattern of said first one of said original master artworks;

(c) generating by said photoplotting means in response to said second set of coded signals a second artwork containing a second image of only lines representative of wires/etches to be added to said wiring pattern of said first one of said original master artworks; and, (d) photographically combining by pinned contact frame table means said original master, said first and said second artworks in a predetermined sequence for producing a new master artwork in which said lines of said first and second images have been removed and added respectively from said wiring pattern of said first one of said original master artworks.

25. The method of claim 24 wherein steps (b) through (d) are repeated for making changes to each of the remaining original master artworks according to first and second sets of signals generated by step (a).

26. The method of claim 24 wherein the step of photographically combining includes the steps of:

first photographically generating a first composite artwork on said pinned contact frame table means by overlaying onto a first unexposed sheet of transparent film media, said first one of said original master artworks and said first artwork, said first composite artwork containing said wiring pattern of said first one of said original master artworks in which said lines of said first image have been removed; and, next, photographically generating a second composite artwork on said pinned contact frame table means by overlaying onto a second unexposed sheet of transparent film media, said first composite artwork and said second artwork, said second composite artwork containing said wiring pattern of said first one of said original master artworks in which said lines of said first and second images have been removed and added respectively.

27. The method of claim 24 wherein said first and second sets of coded signals are introduced manually into said computer aided design system.

28. The method of claim 24 wherein said first and second sets of coded signals are automatically generated by said computer aided design system.

29. The method of claim 24 wherein said first and second sets of coded signals include signals specifying the size characteristics of said lines on said first and second artworks.

30. The method of claim 29 wherein said size characteristics of said lines on said first and second artworks are selected for maximizing the reliability of said multi-wire printed circuit board fabricated from said new master artwork.

* * * * *